(12) United States Patent
Wang et al.

(10) Patent No.: US 6,242,303 B1
(45) Date of Patent: Jun. 5, 2001

(54) NONVOLATILE MEMORIES WITH HIGH CAPACITIVE-COUPLING RATIO

(75) Inventors: Ling-Sung Wang; Chia-Chen Liu, both of Hsinchu (TW)

(73) Assignee: Worldwide Semiconductor Manufacturing Corp., Taiwan (TW)

(*) Notice: Subject to any disclaimer, the term of this patent is extended or adjusted under 35 U.S.C. 154(b) by 0 days.

(21) Appl. No.: 09/440,138

(22) Filed: Nov. 15, 1999

(30) Foreign Application Priority Data

Sep. 17, 1999 (TW) .................................................. 88116131

(51) Int. Cl.$^7$ .................................................. H01L 21/336
(52) U.S. Cl. .................................................. 438/257; 257/317
(58) Field of Search .................................................. 438/257, 260, 438/261, 264, 287; 257/317; 365/185.06, 185.26, 185.15, 185.28

(56) References Cited

U.S. PATENT DOCUMENTS

| | | | |
|---|---|---|---|
| 4,807,003 | * 2/1989 | Mohammadi et al. | 365/187 |
| 5,134,086 | * 7/1992 | Ahn | 438/398 |
| 5,150,179 | * 9/1992 | Gill | 257/321 |
| 5,240,558 | * 8/1993 | Kawasaki et al. | 438/396 |
| 5,460,991 | * 10/1995 | Hong | 438/396 |
| 5,474,950 | * 12/1995 | Kim | 438/396 |
| 5,501,996 | * 3/1996 | Yang et al. | 438/259 |

* cited by examiner

*Primary Examiner*—Amir Zarabian
*Assistant Examiner*—Christian D. Wilson

(57) ABSTRACT

A method for manufacturing an erasable programmable memory is disclosed, and an enlargement of the coupling area between control and floating gates is employed to increase the capacitive-coupling ratio. Firstly, the isolation regions are formed on the substrate. A polysilicon layer is formed on a portion of the control region of the substrate to form an uneven silicon surface. An ion implantation is carried out to form the doped tunnel region and the control gate. A tunnel oxide layer and a non-tunnel oxide layer are formed on the doped tunnel region, and an inter-poly dielectric is formed on the control gate. A floating gate is now deposited on the doped tunnel region and the control gate. Then an inter-layer dielectric is formed and etched to provide the isolation and connect between control gate and interconnects.

20 Claims, 9 Drawing Sheets

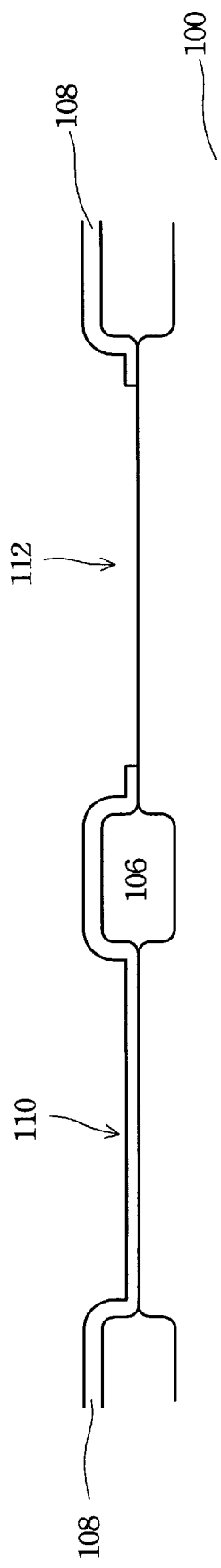
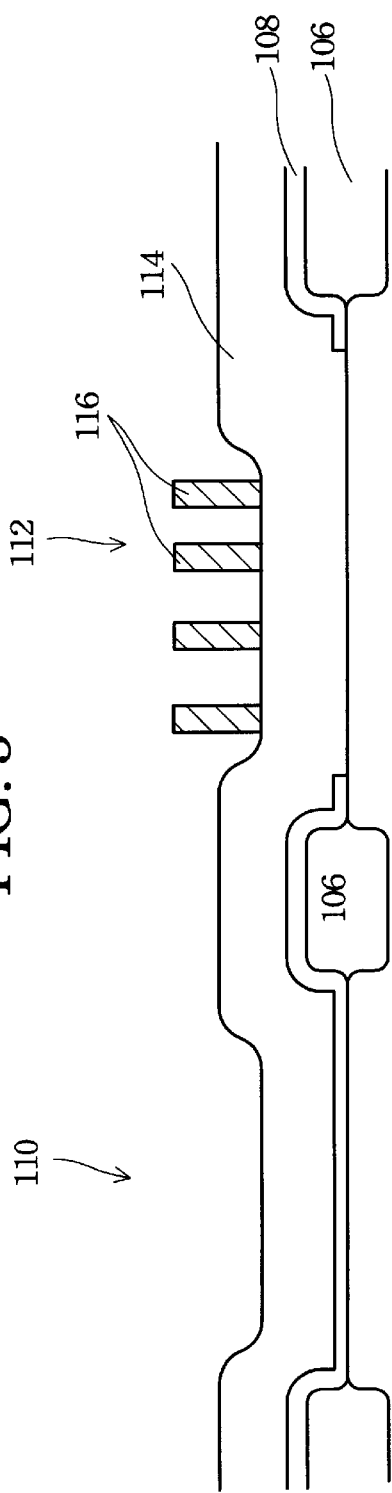
FIG. 5
FIG. 6

NONVOLATILE MEMORIES WITH HIGH CAPACITIVE-COUPLING RATIO

FIELD OF THE INVENTION

The present invention relates to a semiconductor manufacture process, and more especially, to a method for increasing capacitive-coupling ratio of a electrically erasable programmable memory.

BACKGROUND OF THE INVENTION

In the early years of electric and semiconductor industry, traditional programmable semiconductor devices are developed for nonvolatile memories to rewrite the data stored. Nonvolatile memories, including mask read-only memories (Mask ROM), programmable ROM (PROM), erasable programmable ROM (EPROM), electrically erasable programmable ROM (EEPROM or E$^2$PROM) and flash memories, retain their memory data whenever the power is turned off, and have wide applications in the computer and electronic industry. In recent years, erasable programmable logic devices (EPLDs) are also developed to produce semi-manufactured products before order and reduce the period between order and delivery. With the erasable programmable logic devices, standard logic arrays can be fabricated in advance, and the final connections of devices are made in accordance with customer specification. Such an erasable programmable logic device has a programming mechanism all the same to an electrically erasable programmable memory.

FIG. 1 shows a traditional structure of an erasable programmable logic device or an electrically erasable programmable memory. In this structure, there are active area 12, floating gate 14, control gate 18, and select gate 24, also the tunnel window 16 formed between the active area and the floating gate, source region 20 (only the contact window labeled), and drain region 22 (only the contact window labeled). Cross section AA' is shown in FIG. 2, wherein isolation regions of field oxide (FOX) 30, tunnel oxide 16 and non-tunnel oxide 32 between active area and the floating gate, inter-poly dielectric 34 between floating and control gates, and inter layer dielectric (ILD) 36 on floating gate, are formed.

The basic storage cell of these programmable and erasable memories contains a double polysilicon storage transistor with a floating gate isolated in silicon dioxide and capacitively coupled to a second control gate. These memories execute the program and erasure by charging or discharging their floating gates. For example, the EPROM is programmed by hot electron injection at the drain to selectively charge the floating gate and erased by discharging the floating gate with ultraviolet light or X-ray. The E$^2$PROM and most of the flash memories are programmed by hot electron injection or cold electron tunneling named Fowler-Nordheim tunneling, and erased mostly by. Fowler-Nordheim tunneling from the floating gate to the source, with the control gate ground.

Fowler-Nordheim tunneling, or named cold electron tunneling, is a quantum-mechanical effect, which allows the electrons to pass through the energy barrier at the silicon-silicon dioxide interface at a lower energy than required to pass over it. Because of its low current consumption, the Fowler-Nordheim program/erase scheme becomes indispensable for low power operation of the E$^2$PROM and flash memories. But the Fowler-Nordheim program/erase scheme requires high voltage that applied to control gate of the memory cell due to its need for a large reversible electric field to the thin oxide separating the floating gate from the substrate. Therefore, to lower the control gate bias, the memory cell must have a high capacitive-coupling ratio structure.

Capacitive-coupling ratio is defined as the ratio of the capacitance between control and floating gates to the total capacitance of floating gate, also the ratio of the bias of the floating gate to that of the control gate. The total capacitance of floating gate is the capacitance between control and floating gates in addition to the capacitance between floating gate and source region. As its definition, the higher the capacitive-coupling ratio is, the higher the induce bias of floating gate is, wherein the latter is induced by the supplied bias of the control gate. In the other words, applying a same control bias, the induced bias of floating gate is higher as the capacitive-coupling ratio is, as well as the efficiency of the device. Therefore, there is a demand to increase the capacitive-coupling ratio for the manufacture of device with low power consumption and high operation efficiency.

Typically, for a standard capacitor, the capacitance $C=k\in_o A/d$, wherein A is the coupling area of the conductive layer, $\in_o$ is the permittivity of vacuum, d is the thickness of the dielectric layer, and k is the permittivity of the dielectric material employed. In general, there is a lower thickness limit of the inter-poly dielectric between control and floating gate to prevent the occurrence of tunnel. Therefore, the most ideal way to increase the capacitive-coupling ratio is to increase the coupling area between control gate and floating gate. However, as the semiconductor manufacture tend to increase integration of device, the area allowed for a device is decreased day by day. Therefore, it will be a challenge to increase capacitive-coupling ratio in such a decreased device area.

SUMMARY OF THE INVENTION

The present invention proposes a novel method for manufacturing an erasable programmable memory, which utilizes the enlargement of the coupling area between control and floating gates to increase the capacitive-coupling ratio. Firstly, the isolation regions are formed on the substrate to define active areas. A silicon oxide mask is formed on the substrate to cover the tunnel region and expose the control region. A polysilicon layer is subsequently formed on the substrate.

A photoresist is then patterned on the polysilicon layer to cover a portion of the control region and expose the other regions. An anisotropic etching is then performed to pattern the polysilicon layer using the patterned photoresist as a mask. Only the portion of the polysilicon layer on the control region and covered by the photoresist remains. An over etching using the same pattern is selectively performed to etch the exposed portion of the substrate on the control region. After the patterned photoresist is removed and wet cleaned, the oxide mask is stripped, and an uneven silicon surface with protrusions and recesses is thus formed on the control region.

Subsequently, an ion implantation is carried out to implant impurity dopants into the substrate and form the doped tunnel region and the control gate. The control gate consists of the doped polysilicon layer and the doped control region in the substrate. A first silicon oxide layer is then grown on the substrate, the portion of the first silicon oxide layer on the control region is removed, and the portion of the first silicon oxide layer on the surface of tunnel region remains.

Thereafter, a second silicon oxide layer is formed on the substrate. At this moment, there is only this second silicon oxide layer on the control region, but the first and second silicon oxide layers lying on the tunnel region. The second silicon oxide layer is thinner the first silicon oxide layer. Another photoresist is patterned and tunnel window is defined on the tunnel region. The portions of the first and second silicon oxide layers on the tunnel window are removed. The portions of the first and second silicon oxide layers that are not on the tunnel window remain.

A third silicon oxide layer is then formed on the substrate. At this moment, there is only the third silicon oxide layer on the tunnel window to serves as tunnel oxide layer. On the tunnel region other than the tunnel window, the first, second and third silicon oxide layers lie to serve as the non-tunnel oxide layer. On the control region, the second and third silicon oxide layers lie to serve as the inter-poly dielectric. The third silicon oxide layer is also thinner than the first silicon oxide layer.

A floating gate is now deposited on the tunnel region and most area of the control region. On the floating gate, an inter-layer dielectric is formed to serve as the isolation to the overlying interconnects. Finally, the inter-layer dielectric and inter-poly dielectric are etched to form contact window and provide connect between control gate and interconnects.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 5 is a cross-sectional view of a semiconductor wafer illustrating the step of forming a silicon oxide mask to define control region and tunnel region on the substrate according to the ptesent invention;

FIG. 6A is a top view of a semiconductor wafer illustrating the step of forming a column photoresist on the polysilicon layer according to the first embodiment of the present invention;

FIG. 6B is a top view of a semiconductor wafer illustrating the step of forming a net-like photoresist on the polysilicon layer according to the second embodiment of the present invention;

DESCRIPTION OF THE PREFERRED EMBODIMENT

The present invention proposes a novel method for manufacturing an erasable programmable memory. The present method utilizes the enlargement of the coupling area between control and floating gates to increase the capacitive-coupling ratio of the memory device. The method described here includes many standard processes well known in the art like photolithography, etching or chemical vapor deposition (CVD) which are not discussed in detail.

Figure 1:
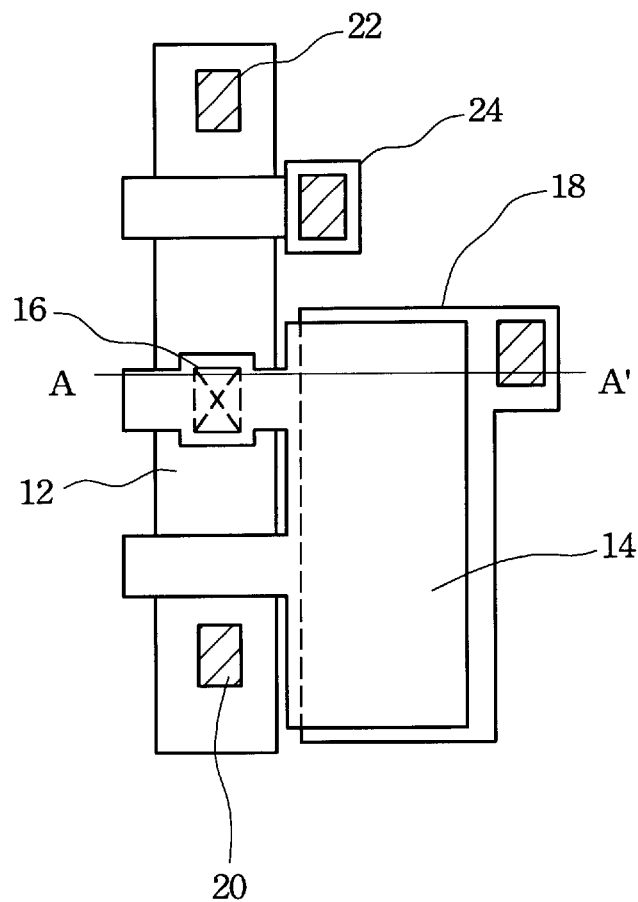
FIG. 1 is a top view of an erasable programmable memory according to the prior art.
Figure 2:
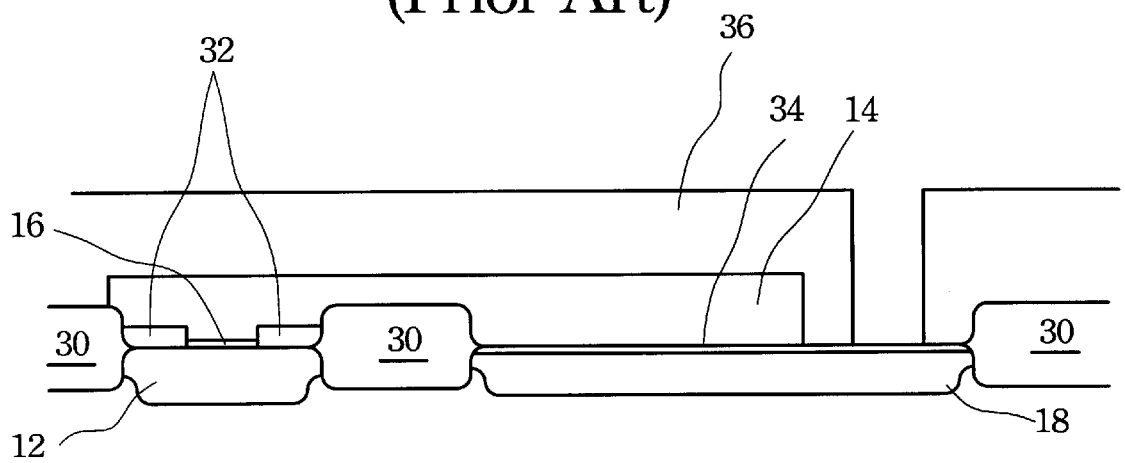
FIG. 2 is a cross-sectional view of an erasable programmable memory according to the prior art.
Figure 3:
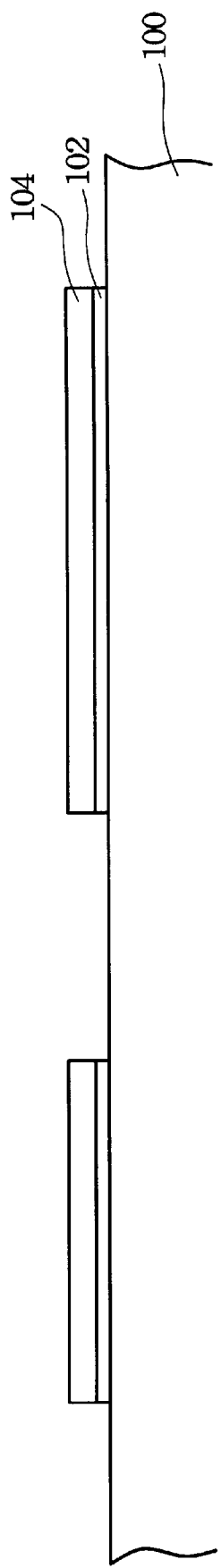
FIG. 3 is a cross-sectional view of a semiconductor wafer illustrating the step of forming a pad oxide layer and a silicon nitride mask on the substrate according to the present invention.

Referring to FIG. 3, a single crystal silicon substrate 100 with a <100> crystallographic orientation is provided. Before the memory device is fabricated, the isolation regions must be formed on the semiconductor substrate 100 to define active areas in advance. A local oxidation of silicon (LOCOS) can be employed for these isolation regions. Firstly, a pad oxide layer 102 is formed on the substrate 100 by using low pressure chemical vapor deposition (LPCVD) at a temperature in the range of about 400 to 750° C. Alternatively, a thermal oxidation can be used at about 800 to 1100° C. to form the pad oxide layer 102. The pad oxide layer 102 is used for reducing the stress between substrate and the nitride mask fabricated later.

Next, a thick silicon nitride layer 104 is formed on the pad oxide layer 102 to serve as the oxidation mask. Similarly, the silicon nitride layer 104 can be formed with low pressure chemical vapor deposition (LPCVD) at a temperature of about 700 to 800° C. The pattern of isolation regions is now defined on the silicon nitride layer 104 by using a conventional manner of photolithography including photoresist coating, exposure, and development processes. Then, a dry etching process is carried out to etch the thick silicon nitride layer 104 and the pad oxide layer 102 to form an oxidation mask. This anisotropic etching can be carried out by using plasma gases containing fluoride such as $CF_4$, $CHF_3$, $C_2F_6$ or $C_3F_8$. These fluoride-containing gases are preferable for this nitride/oxide etching process due to their adjustable etching rate and selectivity between mask layer and the silicon substrate by control the quantities of hydrogen and oxygen contained.

Figure 4:
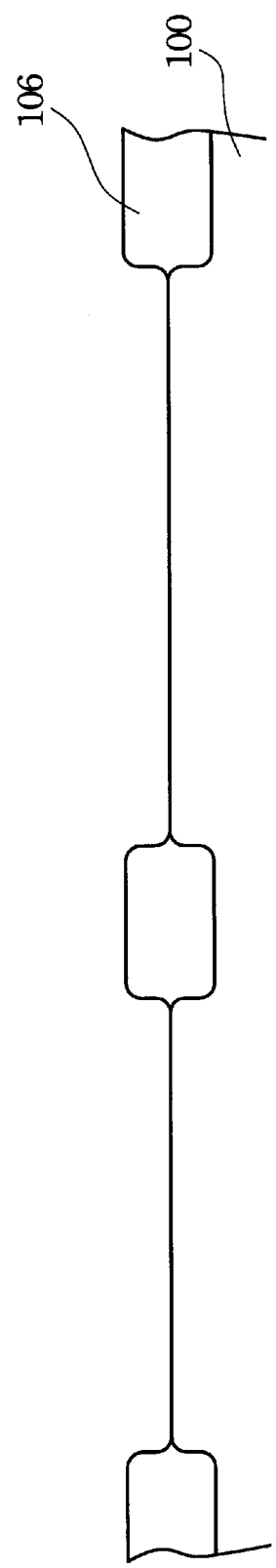
FIG. 4 is a cross-sectional view of a semiconductor wafer illustrating the step of performing a thermal oxidation to form field oxides on the substrate according to the present invention.

After photoresist is removed and wet cleaned, a thermal oxidation in an oxygen steam environment is performed at a temperature of about 800 to 1100° C., and the thick field oxide (FOX) regions 106 are grown with a thickness of about 3000–8000 angstroms, to provide isolation between active areas on the substrate 100. Alternatively, shallow trench isolation (STI) can also be employed instead of local oxidation of silicon (LOCOS) and field oxide (FOX). Then, the silicon nitride layer 104 and pad oxide layer 102 are removed, typically, by wet etching processes. Suitable etchant for removing silicon nitride layer 104 can be hot solution of phosphoric acid ($H_3PO_4$). The pad oxide layer 102 can be removed by using buffered oxide-etching (BOE) solution or diluted solution of hydrofluoric acid (HF) as the etchant. The cross-sectional view of the isolation regions (FOX) is shown in FIG. 4.

Thereafter, a silicon oxide mask 108 is formed on the semiconductor substrate 100. Still, the silicon oxide mask 108 can be formed by using low pressure chemical vapor deposition (LPCVD) or thermal oxidation at respective temperature of about 400 to 750° C. or 800 to 1100° C. Conventional manners of photolithography and etching follow to pattern the silicon oxide mask 108 and define the tunnel region and control region. After patterning, the silicon oxide mask 108 covers the tunnel region 110 and exposes the control region 112 as shown in FIG. 5. The etching process for this silicon oxide mask 108 can be a dry etching using $CF_4$, $CHF_3$, $C_2F_6$ or $C_3F_8$ as the plasma gases.

A polysilicon layer 114 is now formed on the semiconductor substrate 100. This polysilicon can be formed of in-situ doped polysilicon (ISD polysilicon) with a thickness of about 1000 to 3000 angstroms. A low pressure chemical vapor deposition (LPCVD) or plasma enhanced chemical vapor deposition (PECVD) can be employed at a temperature of about 575 to 650° C. for this polysilicon deposition. The dopant for insitu doping can be $PH_3$ or $AsH_3$.

Figure 6:
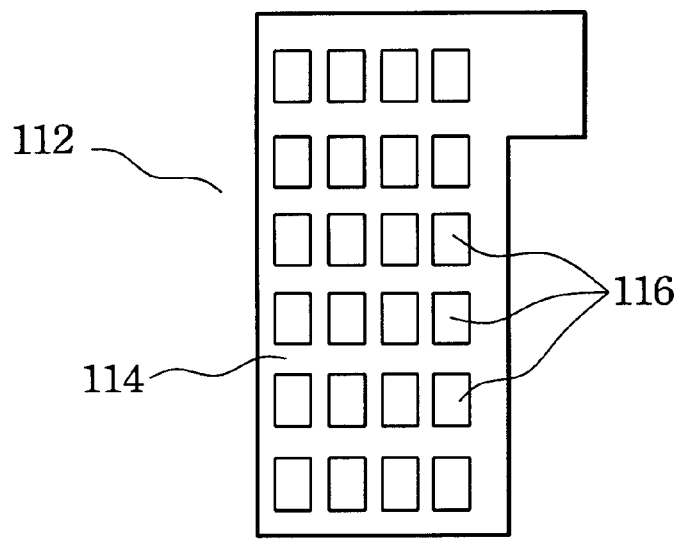
FIG. 6 is a cross-sectional view of a semiconductor wafer illustrating the step of forming a polysilicon layer and patterning a photoresist on the polysilicon layer according to the present invention.
Figure 6:
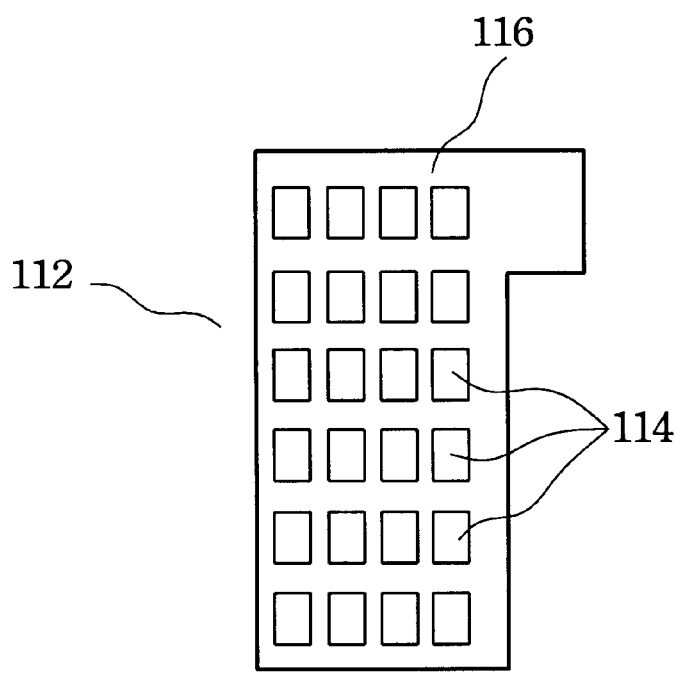

Next, as shown in FIG. 6, a patterned photoresist 116 is formed on the polysilicon layer 114 by using photolithography process. A portion of the control region 112 is covered by this patterned photoresist 116, and the other regions including those other than control region are exposed. In a preferred embodiment, a plurality of photoresist columns 116 is formed with a top view shown FIG. 6A. In another embodiment, photoresist 116 is formed with a net-like top view shown in FIG. 6B. Any other pattern that can cover a portion of the control region 112 and expose the other can also be applied and included in the scope of the present invention.

Figure 7:
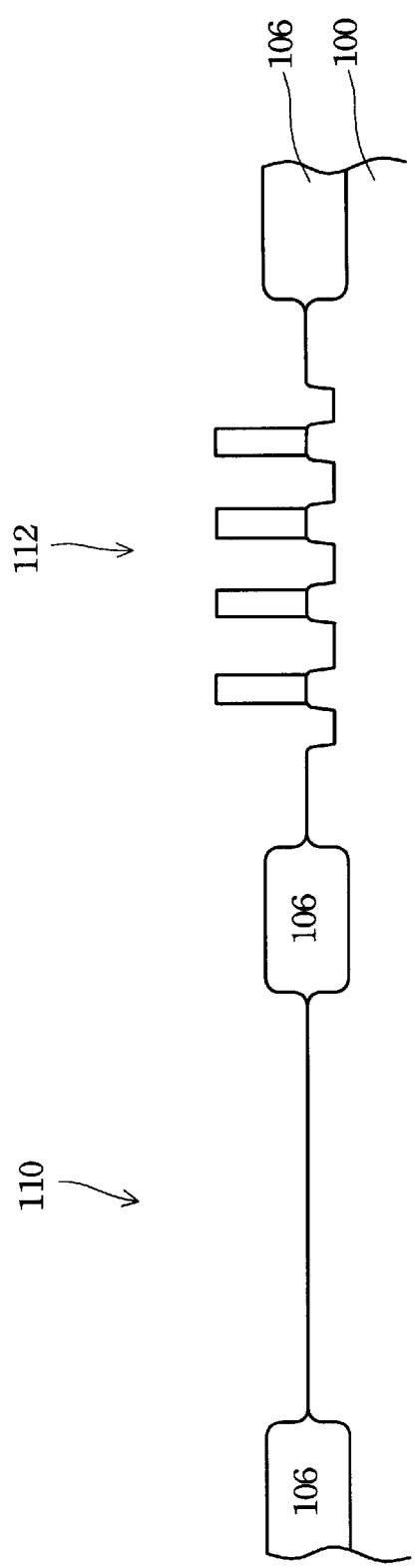
FIG. 7 is a cross-sectional view of a semiconductor wafer illustrating the step of etching the polysilicon layer and the substrate using the silicon oxide mask and the patterned photoresist as the etching mask according to the present invention.

An anisotropic etching is then performed to pattern the polysilicon layer 114 using the patterned photoresist as a mask, and only the portion of the polysilicon layer 114 on the control region 112 and covered by the photoresist 116 remains. A trench etching or over etching using the same pattern is selectively performed to etch the exposed portion of the substrate 100 on the control region 112. At this step, the portion of the substrate 100 other than that of the control region 112 are masked by the silicon oxide mask 108. A plurality of trench structure is formed in the control region 112 of the substrate exposed by the polysilicon layer 114 as shown in FIG. 7. For the polysilicon and substrate etching, $Cl_2$, $BCl_3$, HBr, $SF_6$, or $SiCl_4$ can be employed as the plasma source. After the patterned photoresist 116 is removed and wet cleaned, the oxide mask 108 can be stripped by using buffered oxide-etching (BOE) solution or diluted solution of hydrofluoTic acid (HF) as the etchant. An uneven silicon surface with protrusions and recesses is thus formed on the control region 112.

Figure 8:
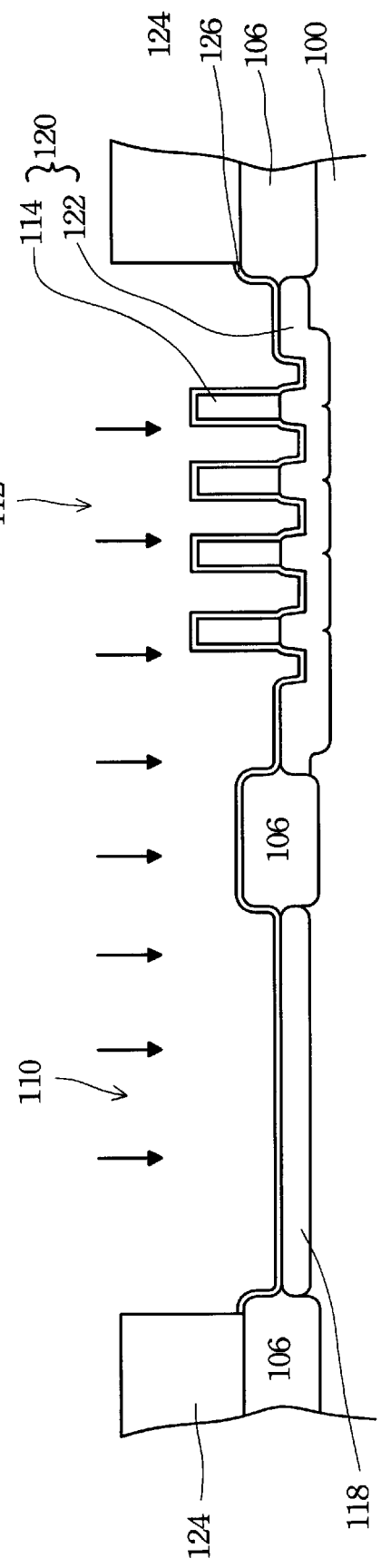
FIG. 8 is a cross-sectional view of a semiconductor wafer illustrating the step of performing an ion implantation to form doped tunnel region and control gate, and forming a first silicon oxide layer on the substrate according to the present invention.

Subsequently, an ion implantation is carried out following the direction indicated by the arrows shown in FIG. 8. Impurity dopants are implanted into the tunnel region 110 and control region 112 of the substrate, and the doped tunnel region 118 and the control gate 120 are formed. The control gate 120 consists of the doped polysilicon layer 114 and the doped control region 122 in the substrate. For an N-type device, the dopants can be phosphorus ions, arsenic ions or antimony ions. In advance to the ion implantation, a sacrificial oxide layer (SAC, not shown in the figure) can be formed by thermal oxidation, and a photoresist 124 is patterned to define the doping regions. The sacrificial oxide layer is employed to protect the substrate from damage by ion bombardment and to prevent the channel effect of the dopants during the ion implantation. Fishing the ion implantation, the photoresist 124 is removed, the sacrificial oxide layer is stripped by wet etching using buffered oxide-etching (BOE) solution or diluted solution of hydrofluoric acid (HF) as the etchant, and a first silicon oxide layer 126 is then regrown on the substrate. The first silicon oxide layer 126 can be formed by thermal oxidation at a temperature of about 800 to 1000° C., or by LPCVD at about 400 to 750° C. The first silicon oxide layer 126 is formed on the surface of the doped tunnel region 118 and control gate 120 with a thickness of about 120–150 angstroms to serve as the main structure of the non-tunnel oxide on the doped tunnel region 118.

Figure 9:
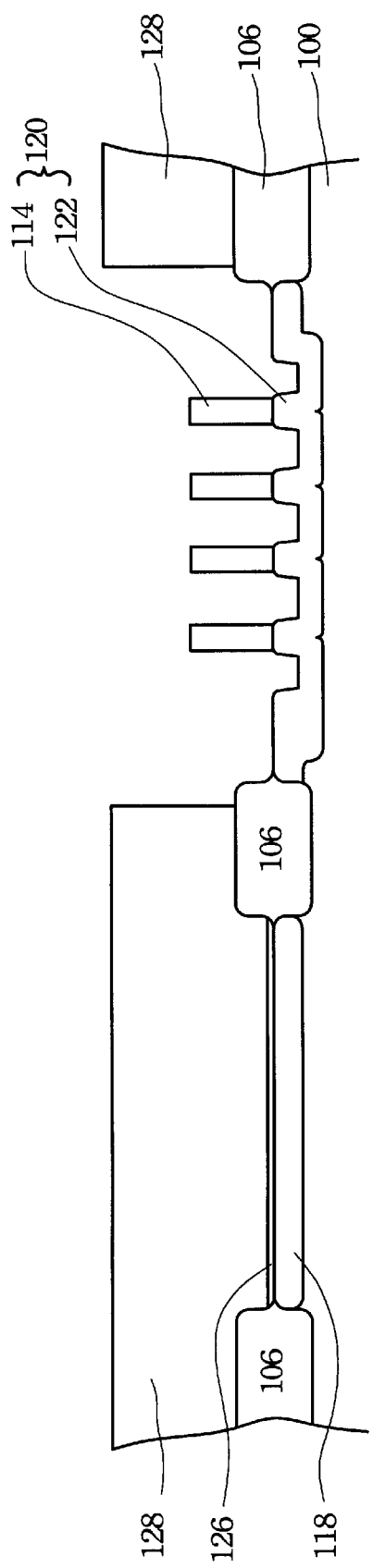
FIG. 9 is a cross-sectional view of a semiconductor wafer illustrating the step of etching the first silicon oxide layer according to the present invention.

Now referring to FIG. 9, a photoresist 128 is formed by photolithography to define the low voltage gate area (LVG area), which is exactly the control region 112. Then, a etching process is performed to removed the portion of the first silicon oxide layer 126 on the surface of the low voltage gate area 112. The portion of the first silicon oxide layer 126 on the surface of tunnel region 110 remains under the cover of the photoresist 128. This etching process for the first silicon oxide layer 126 can be a dry etching using fluoride-containing gases $CF_4$, $CHF_3$, $C_2F_6$, or $C_3F_8$ as the plasma source. Because there is no misgiving about undercut of the field oxide 106, which is located at the periphery of the low voltage gate area 112, wet etching can also be employed alternatively using buffered oxide-etching (BOE) solution or diluted solution of hydrofluoric acid (HF) as the etchant.

Figure 10:
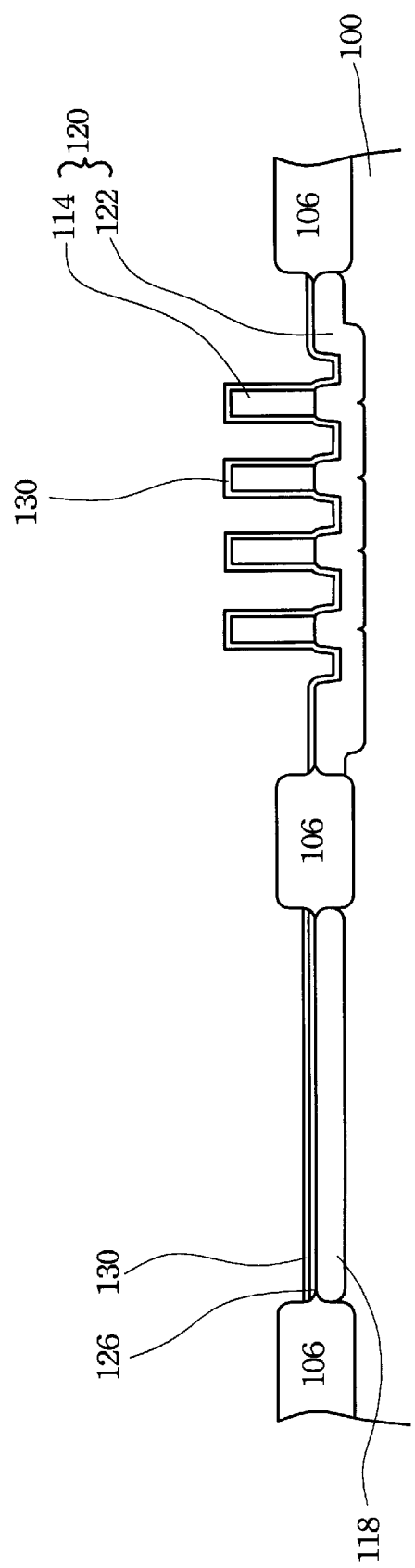
FIG. 10 is a cross-sectional view of a semiconductor wafer illustrating the step of forming a second silicon oxide layer on the substrate according to the present invention.

Thereafter, photoresist 128 is removed and a second silicon oxide layer 130 is formed on the substrate as shown in FIG. 10. At this moment, there is only this second silicon oxide layer 130 on the low voltage gate area 112, but the first and second silicon oxide layer 126 and 130 lying in sequence on the tunnel region 110. The second silicon oxide layer 130, which is thinner the first silicon oxide layer 126, has a thickness of about 75 to 90 angstroms and serves as portions of the non-tunnel oxide and inter-poly dielectric.

Figure 11:
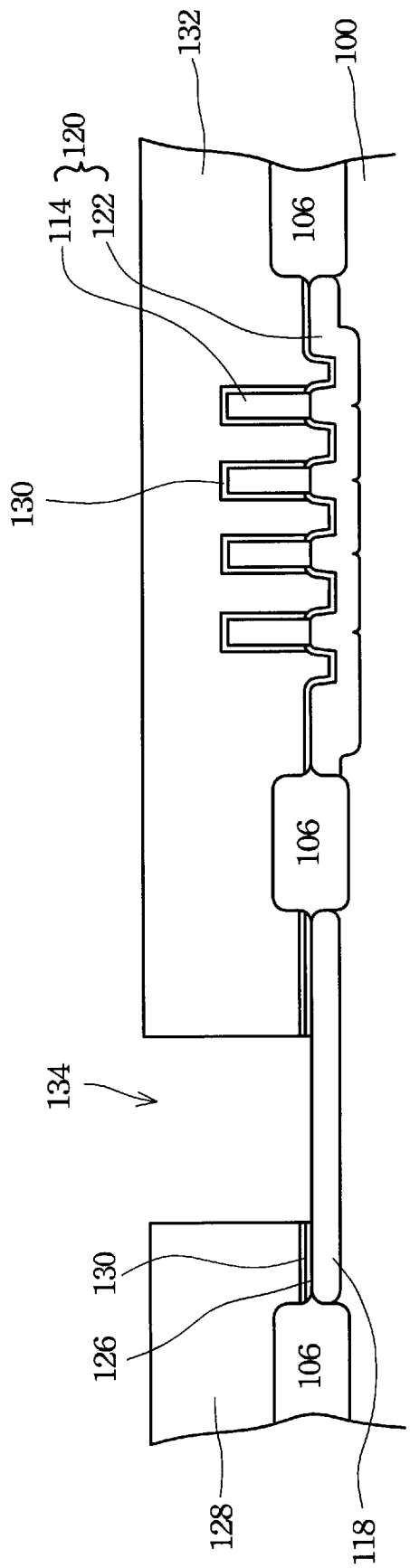
FIG. 11 is a cross-sectional view of a semiconductor wafer illustrating the step of defining tunnel window and removing the first and the second silicon oxide layer on the tunnel window according to the present invention.

Referring to FIG. 11, another photolithography is carried out to pattern a photoresist 132 and define tunnel window 134 on the tunnel region 110 by covering all other areas. An etching process follows to remove the portions of the first and second silicon oxide layers 126 and 130 on the tunnel window 134. The portions of the first and second silicon oxide layer 126 and 130 not on the tunnel window remain under the cover of photoresist 132. Similarly, this oxide etching can be implemented by a dry etching using fluoride-containing gases $CF_4$, $CHF_3$, $C_2F_6$, or $C_3F_8$ as the plasma source, or a wet etching using buffered oxide-etching (BOE) solution or diluted solution of hydrofluoric acid (HF) as the etchant.

Figure 12:
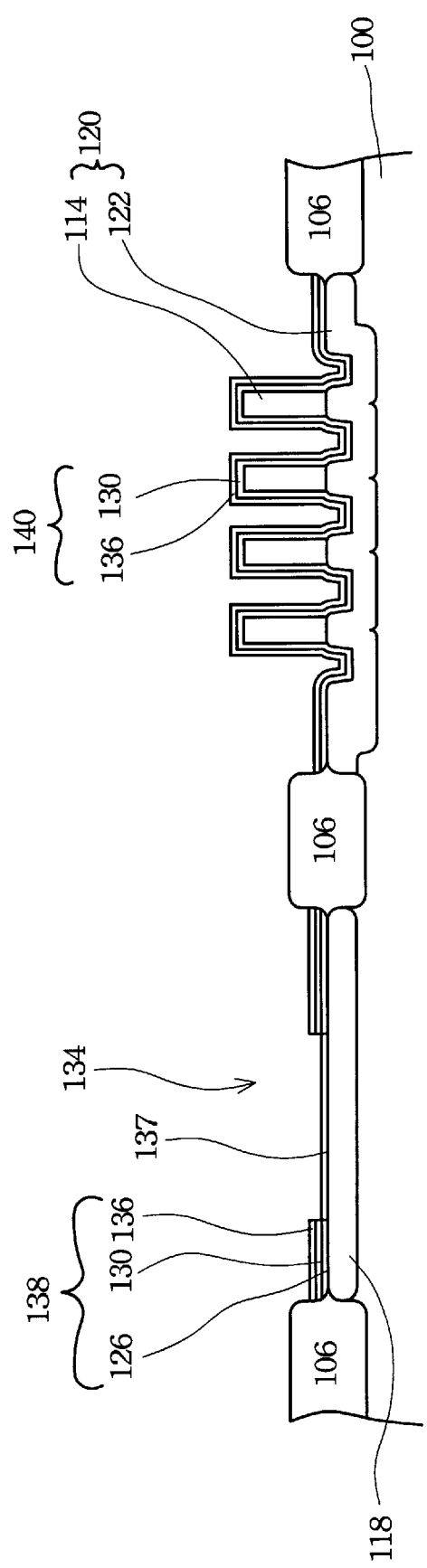
FIG. 12 is a cross-sectional view of a semiconductor wafer illustrating the step of forming a third silicon oxide layer on the substrate according to the present invention.

After the oxide layers on the tunnel window are removed, the photoresist 132 is also removed and wet cleaned, and a third silicon oxide layer 136 is formed on the substrate 100 as shown in FIG. 12. At this moment, there is only the third silicon oxide layer on the tunnel window 134. On the tunnel region other than the tunnel window, the first, second and third silicon oxide layers 126, 130 and 136 lie in sequence to form a triple film 138 and serve as the non-tunnel oxide layer. On the low voltage gate area 112, the second and the third silicon oxide layers 130 and 136 lie together to form a double film 140 and serve as the inter-poly dielectric. The third silicon oxide layer 136 is also thinner than the first silicon oxide layer 126 and has a thickness of about 75–90 angstroms. The portion of the third silicon oxide layer 136 on the tunnel window serves as tunnel oxide layer 137 and is constructed for the generation of the cold electron tunneling named Fowler-Nordheim tunneling.

Figure 13:
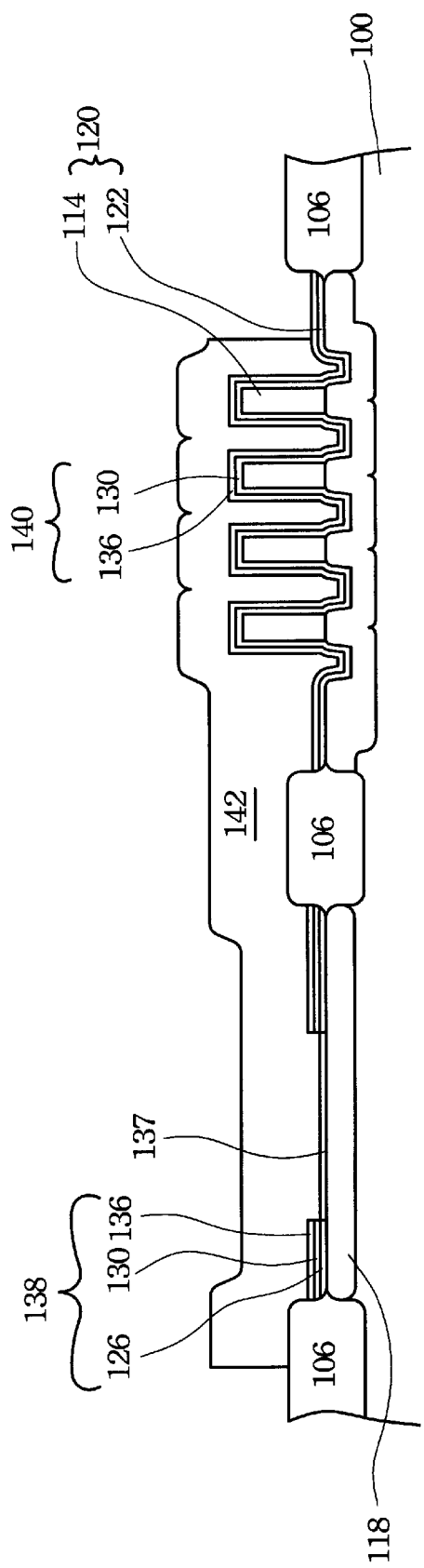
FIG. 13 is a cross-sectional view of a semiconductor wafer illustrating the step of forming a floating gate on the substrate according to the present invention.

After the tunnel oxide layer 137, non-tunnel oxide 138 and the inter-poly dielectric 140 are formed, a floating gate 142 is deposited across the field oxide 106 on the tunnel region 110 and most area of the control region 112 as shown in FIG. 13. A portion of the inter-poly dielectric 140 is exposed. Typically, the floating gate 142 is formed of doped polysilicon with LPCVD or PECVD at a temperature of about 575 to 650° C. The doping method can be a doping after deposition using $POCl_3$ or $P_2O_5$ as the dopants. The in-situ doping using $PH_3$ or $AsH_3$ as the dopants can alternatively be employed for this polysilicon doping. In addition, conductive material other doped polysilicon, such as metals or metal compound can also be used. In the case, metals like titanium (Ti), tungsten (W), tantalum (Ta), nickel (Ni), palladium (Pd), platinum (Pt), cobalt (Co), molybdenum (Mo), strontium (Sr), yttrium (Y), ruthenium (Ru), lead (Pb) or metal compounds like metal nitride, metal silicide, and metal oxide of above mentioned metals can be used. The metal or metal compound can be deposited with a chemical vapor deposition (CVD) process, or a physical vapor deposition (PVD), that is, sputtering process. The thickness of the floating gate is determined according to the design rule and the requirement for the conductivity.

Figure 14:
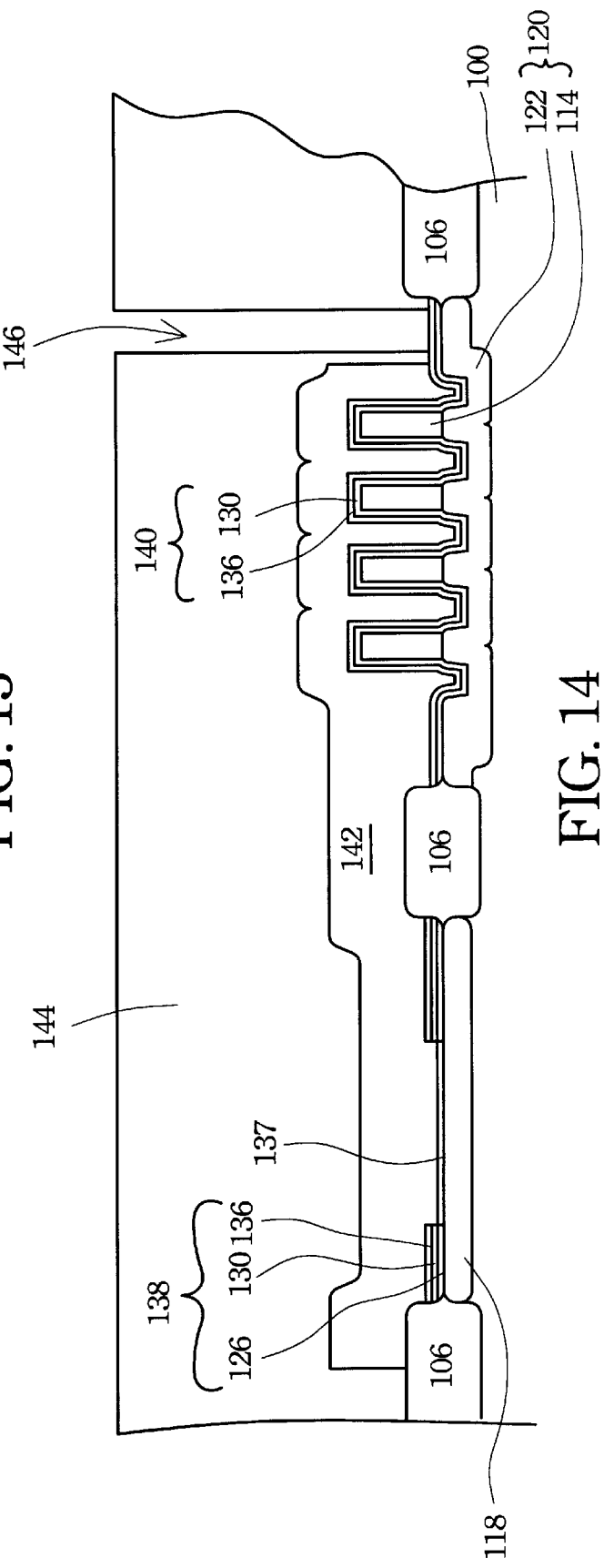
FIG. 14 is a cross-sectional view of a semiconductor wafer illustrating the step of forming a inter-layer dielectric on the substrate and opening a contact window in the inter-layer dielectric according to the present invention.

Referring to FIG. 14, on the polysilicon floating gate 142, an inter-layer dielectric 144 is formed by a blanket deposition to serve as the isolation to the overlying interconnects. The inter-layer dielectric 144 is generally deposited using a conventional low pressure chemical vapor deposition (LPCVD), plasma enhanced chemical vapor deposition (PECVD), or high density plasma chemical vapor deposition (HDPCVD). A spin-on coating can also be employed. An oxide material of tetraethyl-ortho-silicate-oxide (TEOS-oxide), ozone TEOS-oxide, borophospho silicate glass (BPSG), phospho silicate glass (PSG), boro silicate glass, (BSG), undoped silicate glass (USG) or silicon-rich oxide (SRO), and so on, can be employed for this inter-layer dielectric 144. Materials with lower dielectric constant, such as fluorine-doped silicon oxide (or named fluorosilicate Glass, FSG) or hydrogen silsesquioxane (HSQ), are another choices for this dielectric. The fluorine-doped silicon oxide can be formed with chemical vapor deposition such as LPCVD or PECVD, and the hydrogen silsesquioxane is formed with spin-on glass process.

Finally, the inter-layer dielectric 144 and inter-poly dielectric 140 are anisotropically etched according to the layout design, and a contact window 146 is opened in the inter-layer dielectric 144. The contact window 146 is formed to provide connect between the control gate 120 and the interconnects. The dielectric etching can be dry etching using fluoride-containing gases $CF_4$, $CHF_3$, $C_2F_6$, or $C_3F_8$ as the plasma source.

Figure 15:
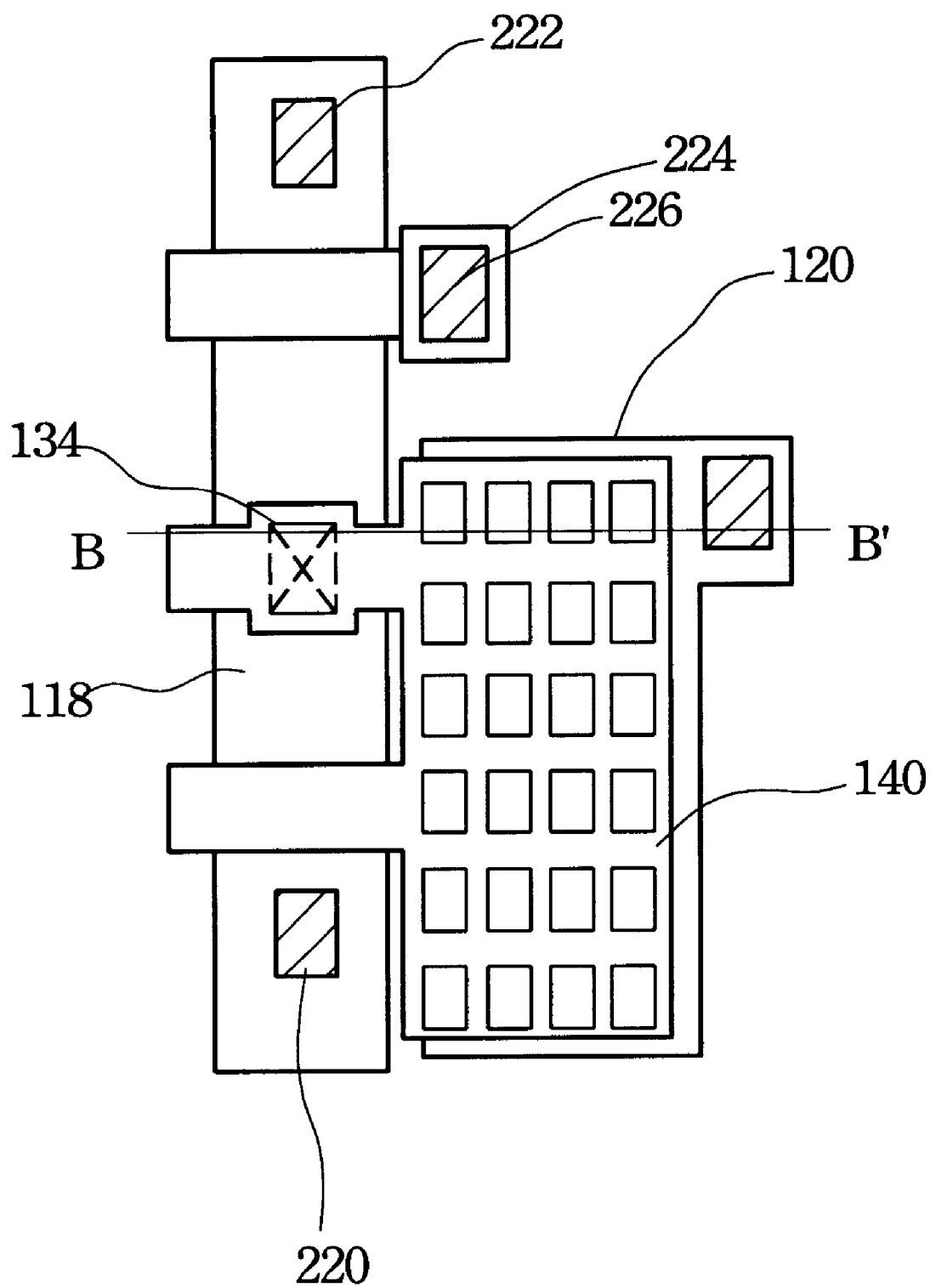
FIG. 15 is a top view of an erasable programmable memory according to the present invention.

FIG. 15 displays the top view of the erasable programmable memory manufactured by the present invention in accordance with the processes described above. The present memory comprises active area 118 (doped tunnel region), control gate 120 (including doped polysilicon layer 114 and the doped control region 122), floating gate 140, select gate 224, source region with contact window 220, drain region with contact window 222, tunnel window 134, and the contact window 146 for control gate and 226 for select gate. The BB' cross section is illustrated in FIG. 3 to FIG. 14 for the manufacturing formulation of the present erasable programmable memory. In addition, the contact window for source, drain and select gate can be formed simultaneously when the contact window 146 for control gate is formed. The select gate can be formed simultaneously as the floating gate is formed.

According to aforementioned processes and structure, the present invention proposes a method to fabricate an erasable programmable memory. The coupling area between the control gate 120 and the floating gate 142 can be enlarged. As shown in FIG. 14 and FIG. 15, there are uneven interface with protrusions and recesses between the control gate 120 and the floating gate 142 due to the presence of the polysilicon layer 130 and the trench structure of the substrate. The capacitive-coupling ratio of the memory is substantially increased, as well as the operation efficiency of the memory device.

As is understood by a person who is skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing an erasable programmable memory on a semiconductor substrate, said method comprising:

forming isolation regions on said semiconductor substrate to define active areas and expose a tunnel region and a control region;

forming a conductive structure with an uneven surface on a portion of said control region and exposing a portion of said control region of said semiconductor substrate;

performing an ion implantation to implant dopants into said tunnel region and said control region of said semiconductor substrate and form doped tunnel region and doped control region in said semiconductor substrate, wherein said doped control region and said conductive structure serve as a control gate;

forming an inter-poly dielectric on said control gate, a tunnel dielectric and a non-tunnel dielectric on said doped tunnel region;

forming a floating gate on said semiconductor substrate, said floating gate covering said tunnel dielectric and exposing a portion of said inter-poly dielectric;

forming an inter-layer dielectric on said floating gate; and etching said inter-layer dielectric and said inter-poly dielectric to form a contract window and expose a portion of said control gate.

2. The method according to claim 1, wherein said isolation regions are selected from the group consisting of field oxides and trench isolation regions.

3. The method according to claim 1, wherein said conductive structure comprises a plurality of conductive columns.

4. The method according to claim 1, wherein said conductive structure has a net-like top view.

5. The method according to claim 1, wherein said conductive structure is formed by following steps:
forming a dielectric mask on said semiconductor substrate and exposing said control region;
depositing a conductive layer on said semiconductor substrate;
etching said conductive layer to form said conductive structure on a portion of said control region; and
removing said dielectric mask.

6. The method according to claim 5 further comprising a step to etch said semiconductor substrate and form a plurality of trenches in said semiconductor substrate exposed by said conductive structure before said dielectric mask is removed.

7. The method according to claim 1 further comprising a step to form a sacrificial oxide layer on said semiconductor substrate before said ion implantation is performed.

8. The method according to claim 7 further comprising a step to remove said sacrificial oxide layer after said ion implantation is performed.

9. The method according to claim 1, wherein said inter-poly dielectric, said tunnel dielectric and said non-tunnel dielectric are formed by following steps:
forming a first dielectric layer on said doped tunnel region of said semiconductor substrate;
forming a second dielectric layer on said semiconductor substrate;
forming a photoresist on said semiconductor substrate to define a tunnel window on said doped tunnel region by exposing said tunnel window;
etching said first dielectric layer and said second dielectric layer on said tunnel window by using said photoresist as etching mask;
removing said photoresist; and
forming a third dielectric layer on said semiconductor substrate, wherein a portion of said third dielectric on said tunnel window serve as said tunnel dielectric, portions of said second dielectric layer and said third dielectric layer on said control gate serve as said inter-poly dielectric, portions of said first dielectric layer, said second dielectric layer and said third dielectric layer on said doped tunnel region other than said tunnel window serve as said non-tunnel dielectric.

10. The method according to claim 9, where said first dielectric layer is thicker than said second dielectric layer, as well as thicker than said third dielectric layer.

11. The method according to claim 9, where said first dielectric layer, said second dielectric layer, and said third dielectric layer are respectively formed with thickness in the range of about 120 to 150 angstroms, 75 to 90 angstroms, and 75 to 90 angstroms.

12. A method for manufacturing an erasable programmable memory on a semiconductor substrate, said method comprising:
forming isolation regions on said semiconductor substrate to define active areas and expose a tunnel region and a control region;
forming a dielectric mask on said semiconductor substrate and exposing said control region;
depositing a conductive layer on said semiconductor substrate;
etching said conductive layer to form said conductive structure with an uneven surface on a portion of said control region and exposing a portion of said control region of said semiconductor substrate;
removing said dielectric mask;
performing an ion implantation to implant dopants into said tunnel region and said control region of said semiconductor substrate and form doped tunnel region and doped control region in said semiconductor substrate, wherein said doped control region and said conductive structure serve as a control gate;
forming a first dielectric layer on said doped tunnel region of said semiconductor substrate;
forming a second dielectric layer on said semiconductor substrate;
forming a photoresist on said semiconductor substrate to define a tunnel window on said doped tunnel region by exposing said tunnel window;
etching said first dielectric layer and said second dielectric layer on said tunnel window by using said photoresist as etching mask;
removing said photoresist;
forming a third dielectric layer on said semiconductor substrate, wherein a portion of said third dielectric on said tunnel window serve as a tunnel dielectric, portions of said second dielectric layer and said third dielectric layer on said control gate serve as an inter-poly dielectric, portions of said first dielectric layer, said second dielectric layer and said third dielectric layer on said doped tunnel region other than said tunnel window serve as a non-tunnel dielectric;
forming an inter-poly dielectric on said control gate, a tunnel dielectric and a non-tunnel dielectric on said doped tunnel region;
forming a floating gate on said semiconductor substrate, said floating gate covering said tunnel dielectric and exposing a portion of said inter-poly dielectric;
forming an inter-layer dielectric on said floating gate; and
etching said inter-layer dielectric and said inter-poly dielectric to form a contract window and expose a portion of said control gate.

13. The method according to claim 12, wherein said isolation regions are selected from the group consisting of field oxides and trench isolation regions.

14. The method according to claim 12, wherein said conductive structure comprises a plurality of conductive columns.

15. The method according to claim 12, wherein said conductive structure has a net-like top view.

16. The method according to claim 12 further comprising a step to etch said semiconductor substrate and form a plurality of trenches in said semiconductor substrate exposed by said conductive structure before said dielectric mask is removed.

17. The method according to claim 12 further comprising a step to form a sacrificial oxide layer on said semiconductor substrate before said ion implantation is performed.

18. The method according to claim 17 further comprising a step to remove said sacrificial oxide layer after said ion implantation is performed.

19. The method according to claim 12, wherein said first dielectric layer is thicker than said second dielectric layer, as well as thicker than said third dielectric layer.

20. The method according to claim 12, wherein said first dielectric layer, said second dielectric layer, and said third dielectric layer are respectively formed with thickness in the range of about 120 to 150 angstroms, 75 to 90 angstroms, and 75 to 90 angstroms.

* * * * *